(12) United States Patent
Clarke

(10) Patent No.: US 6,337,604 B1
(45) Date of Patent: Jan. 8, 2002

(54) CRYSTAL OSCILLATOR

(75) Inventor: David Clarke, Swindon (GB)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/569,857

(22) Filed: May 12, 2000

(30) Foreign Application Priority Data

May 14, 1999 (GB) .............................................. 9911295

(51) Int. Cl.[7] .............................. H03B 5/32; H03B 5/36
(52) U.S. Cl. .................... 331/116 R; 331/158; 331/179
(58) Field of Search ....................... 331/116 R, 116 FE, 331/117 R, 117 FE, 158, 177 V, 179

(56) References Cited

U.S. PATENT DOCUMENTS

| | | |
|---|---|---|
| 4,179,671 A | 12/1979 | Yoshida et al. |
| 4,346,537 A | 8/1982 | Msujima et al. |
| 4,581,593 A | 4/1986 | Okanobu |
| 5,047,734 A | 9/1991 | Newell et al. |
| 5,053,723 A | 10/1991 | Schemmel |
| 5,142,251 A * | 8/1992 | Boomer ................. 331/116 FE |
| 5,162,746 A * | 11/1992 | Ghoshal ..................... 328/155 |
| 5,469,116 A | 11/1995 | Slemmer |
| 5,534,826 A * | 7/1996 | Logan ......................... 331/158 |
| 5,736,904 A | 4/1998 | Humphreys et al. |
| 5,805,029 A | 9/1998 | Theus et al. |

FOREIGN PATENT DOCUMENTS

| | | |
|---|---|---|
| GB | 2043383 | 2/1980 |
| WO | WO92/11691 | 7/1992 |
| WO | WO9213387 | 8/1992 |
| WO | WO9834338 | 8/1998 |

OTHER PUBLICATIONS

Patent Abstract of Japan, vol. 1998, JP 10051238 (Asahi Kasei Micro Syst KK), Feb. 20, 1998.

* cited by examiner

Primary Examiner—David Mis
(74) Attorney, Agent, or Firm—Burns, Doane, Swecker & Mathis, L.L.P.

(57) ABSTRACT

A crystal oscillator comprises a crystal 1 and a crystal oscillator circuit 3 for providing an output signal 5. In order to adjust the output frequency, for example during the testing stage of production, a bank of load capacitors C1 to C6 are provided. Each capacitor C1 to C6 may be switched into or out of the circuit by a respective switch 9 to 19. The switches are controlled by control lines D0 to D5, which are set by a 6 bit register 21, known as the trim register. The value in the trim register is set according to the frequency of the output signal. To counteract any swing in the output signal, a bank of current switches T1 to T4 are provided, which enable resistors R1 to R4 to be switched into or out of the circuit. Each resistor R1 to R4 is switched by a respective one of the control lines D2 to D5. Thus, adjusting the load capacitance to obtain a desired frequency causes the oscillator core current to be changed automatically, thereby maintaining a constant swing in the output signal.

18 Claims, 1 Drawing Sheet

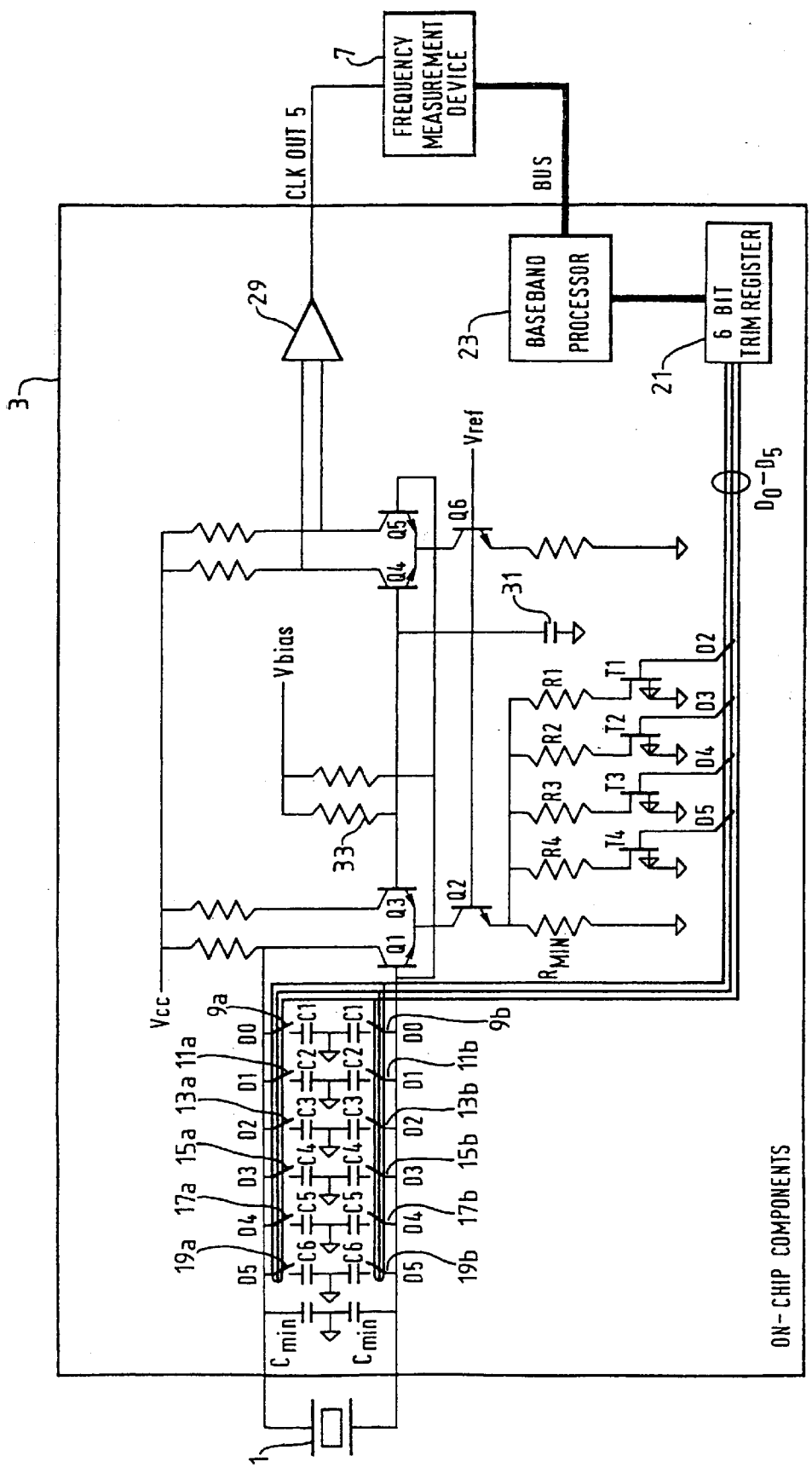

CRYSTAL OSCILLATOR

This application claims priority under 35 U.S.C. §§119 and/or 365 to 9911295.5 filed in the United Kingdom on May 14, 1999; the entire content of which is hereby incorporated by reference.

FIELD OF THE INVENTION

The invention relates to a crystal oscillator, and in particular to a circuit and method for adjusting the output frequency of the oscillator without affecting the swing of the output signal.

BACKGROUND TO THE INVENTION

The centre frequency produced by a crystal oscillator may be adjusted by changing or trimming the load capacitance of the crystal. An example of such an oscillator may be found in WO98/34338.

Trimming the load capacitance in this manner has an adverse effect in that the swing of the output signal is subject to change. To compensate for this change, it is known to use automatic gain control (AGC) to maintain a constant swing of the output frequency. However, using AGC introduces other effects, which may be undesirable, particularly when it is desired to manufacture the oscillator circuit as an integrated circuit.

Firstly, additional circuitry is required to provide AGC. This brings additional cost, and perhaps more importantly for portable devices, additional power supply requirements. The extra circuitry required by AGC includes a voltage level detector, a voltage reference, a filter and a comparator. The comparator is provided to compare the reference voltage with the detected level, and adjust the current within the oscillator core accordingly to achieve a constant swing.

Secondly, the addition of AGC circuitry forms a feedback loop which means that a settling time is introduced before a given output swing can be relied upon.

The aim of the present invention is to provide a trimmable crystal oscillator having a constant swing, but without having the disadvantages mentioned above.

SUMMARY OF THE INVENTION

According to a first aspect of the invention, there is provided a crystal oscillator circuit comprising an adjustable load capacitance, and means for controlling the load capacitance to obtain a particular centre frequency, and means for drawing a crystal core current in accordance with the chosen load capacitance.

According to another aspect of the present invention, there is provided a method of providing a desired output frequency from a crystal oscillator circuit, the method comprising the steps of adjusting the load capacitance of the crystal oscillator circuit to obtain the desired output frequency, and drawing a crystal core current in accordance with a chosen load capacitance.

BRIEF DESCRIPTION OF THE DRAWINGS

For a better understanding of the present invention, and to show more clearly how it may be carried into effect, reference will now be made, by way of example, to the accompanying drawings, in which: The FIGURE shows a crystal oscillator according to the present invention.

DETAILED DESCRIPTION OF A PREFERRED EMBODIMENT OF THE INVENTION

The FIGURE shows a crystal oscillator according to the present invention. It comprises a crystal 1 and an oscillator circuit 3 for providing an output signal 5. The oscillator circuit is advantageously formed as an integrated circuit.

A description of the known components of the oscillator circuit 3 will first be given. The basic oscillating circuit is formed around crystal 1 which is connected across the base and collector of a transistor Q1. A load capacitance Cmin is connected in parallel with the crystal 1, and a current source is provided by Q2 and resistor Rmin.

As is well known in the art, Q3 is provided to form a differential amplifier circuit.

Instead of taking the output signal directly from the collectors of Q1 and Q3, a second differential pair Q4, Q5 is provided. Q4 has its base biased to the same voltage as that of Q3, that is, fixed at a predetermined voltage via decoupling capacitor 31 and resistor 33 by a bias voltage $V_{bias}$. Q5 has its base biased to the same voltage as that of Q1. The provision of the second differential pair means that the oscillator circuit (based around Q1) is not loaded by the output, since the output signal is taken across the collectors of Q4 and Q5 respectively, and is further limited by comparator 29 to provide a standard CMOS clock signal (clk-out).

In order to adjust the output frequency, the oscillating circuit 3 has a bank of load capacitors C1 to C6. Each capacitor C1 to C6 may be connected in parallel with Cmin by closing pairs of respective switches 9 to 19. Each switch pair is controlled by a respective one of a group of control lines D0 to D5. The desired output frequency may therefore be selected by selecting the appropriate load capacitance, in a way which is known to the person skilled in the art.

According to the invention, to counteract any swing in the output signal, a bank of current switches are provided. Each current switch comprises a resistor R1 to R4 and associated switch T1 to T4 (preferably FETs). Each current resistor R1 to R4 may be switched into circuit by a respective one of the control lines D2 to D5. Although it is possible to obtain finer correction by having additional resistor values associated with control lines D0 and D1, the resistance values for such fine correction would become physically too large for an integrated circuit application. Therefore, in the preferred embodiment, current resistors controlled by lines D0 and D1 have been omitted.

Selecting a particular load capacitance using control lines D0 to D5 will select a particular value of emitter resistance of the transistor Q2, and hence will cause a different oscillator core current to be selected. The values of the resistors R1–R4 can be selected to produce a core current which thereby compensates for any swing in the oscillator output signal.

Control lines D0 to D5 are set by a register 21, referred to herein as a "trim" register. The value output on the control lines D0–D5 from the trim register 21 is set by a baseband processor 23 according to the output frequency measured by a frequency measurement device 7.

In operation, under nominal conditions the centre or start point for the oscillator is with control line D5 active, and control lines D4 to D0 non-active. This means that switches 19a and 19b are closed, thereby connecting C6 in parallel with Cmin across the crystal 1. Furthermore, when control line D5 is active, current switch T4 is turned on, so that resistor R4 is connected in parallel with Rmin, thereby setting the oscillator core current.

With these initial start conditions, the output frequency is measured by the frequency measuring device 7. The frequency measurement may take place, for example, during production testing of the device. If the frequency is not within range, the baseband processor 23 is addressed via bus 25.

Depending upon how much the output frequency has to be adjusted, the baseband processor will decide on a new data value to be sent to the 6 bit trim register 21, thereby setting the values D0 through D5. The trim value can thus be used to alter which load capacitances C1 to C6 are to be connected in parallel with the crystal 1, and simultaneously adjust the core current by switching in the appropriate current resistor R1 to R4.

Changing the load capacitance will alter the output frequency, and in theory attempt to change the swing of the output signal. However, since the trim value will also change the core current, the output swing is maintained constant.

The frequency measurement and setting of the trim value may be iterated until the output signal has the desired frequency. The trim value is then permanently held in memory in the baseband processor 23, and recalled to the trim register 21 on power up to ensure the correct frequency for the life of the oscillator.

The six bit trim register enables sixty four values of load capacitance to be selected for adjusting the frequency of the oscillator.

The invention described above maintains a constant swing at the oscillator output when the load capacitance is changed, and requires less current than prior art devices using AGC. Also, the circuit is simple and requires only the addition of simple current switches in the oscillator core. These features, together with the fact that large capacitors are not needed, mean that less silicon area is required to realise the invention in an integrated circuit.

Furthermore, since there is no feedback loop, there is no associated settling time before obtaining a reliable constant swing.

Although the trim register 21 has been described as a six bit register, it may be of any size. For example, it may be larger if a greater degree of adjustability is required in the output frequency.

Also, although the preferred embodiment has four current resistors R1–R4 for use with six load capacitances C1–C6, the ratio of current resistors to load capacitors may be 1:1, or indeed any other ratio.

Furthermore, although the invention has been described in connection with trimming the frequency during production testing, it is also possible that the invention could be used to adjust the frequency during use.

What is claimed is:

1. A crystal oscillator circuit comprising:
   an adjustable load capacitance including a bank of capacitors;
   first switches switching the capacitors into or out of the circuit to obtain a particular centre frequency;
   a bank of resistors; and
   second switches switching the resistors into or out of the circuit in order to vary an oscillator core current which is drawn in accordance with the chosen load capacitance.

2. A crystal oscillator circuit as claimed in claim 1, wherein the adjustable load capacitance comprises a bank of capacitors, and means for switching the capacitors into or out of the circuit.

3. A crystal oscillator circuit as claimed in claim 2, wherein each capacitor in the bank may be individually connected or disconnected from the oscillator circuit.

4. A crystal oscillator circuit as claimed in claim 1, wherein the means for drawing a crystal core current comprises a bank of resistors, and means for switching the resistors into or out of the circuit.

5. A crystal oscillator circuit as claimed in claim 4, wherein each resistor in the bank may be individually connected or disconnected from the oscillator circuit.

6. A crystal oscillator circuit as claimed in claim 1, wherein the means for controlling the load capacitance comprises a plurality of control lines, which determine which capacitors are connected to the oscillating circuit.

7. A crystal oscillator circuit as claimed in claim 6, wherein the control lines also determine which resistors are connected to the oscillating circuit.

8. A crystal oscillator circuit as claimed in claim 5, wherein the status of the control lines are set by a register containing a binary value, each bit of the binary value representing the status of a respective control line.

9. A crystal oscillator circuit as claimed in claim 8, wherein the binary value is set according to the frequency measured at the output of the oscillator.

10. A method of providing a desired output frequency from a crystal oscillator circuit, the method comprising the steps of adjusting the load capacitance of the crystal oscillator circuit to obtain the desired output frequency, the load capacitance being adjusted by switching one or more capacitors from a bank of capacitors into or out of the circuit; and
    switching one or more resistors into or out of the circuit, in order to vary an oscillator core current which is drawn in accordance with the chosen load capacitance.

11. A method as claimed in claim 10, wherein the load capacitance is adjusted by switching capacitors, from a bank of capacitors, into or out of the circuit.

12. A method as claimed in claim 11, wherein each capacitor in the bank may be switched individually into or out of the circuit.

13. A method as claimed in claim 10, wherein the crystal core current is drawn by switching resistors, from a bank of resistors, into or out of the circuit.

14. A method as claimed in claim 13, wherein each resistor may be switched individually into or out of the circuit.

15. A method as claimed in claim 10, wherein the capacitors and resistors are switched into or out of the circuit by a plurality of control lines.

16. A method as claimed in claim 15, wherein the status of each control line is set by a register containing a binary value, each bit of the binary value representing the status of a respective control line.

17. A method as claimed in claim 16, wherein the binary value is set according to the frequency measured at the output of the oscillator.

18. A method as claimed in claim 10, wherein the desired frequency is set during production of the crystal oscillator circuit.

* * * * *